(12) United States Patent
Huang et al.

(10) Patent No.: US 11,150,311 B2
(45) Date of Patent: Oct. 19, 2021

(54) DEVICE AND METHOD FOR DETECTING DEFECT CONTOUR WITH OMNIDIRECTIONALLY EQUAL SENSITIVITY BASED ON MAGNETIC EXCITATION

(71) Applicant: Tsinghua University, Beijing (CN)

(72) Inventors: Songling Huang, Beijing (CN); Wenzhi Wang, Beijing (CN); Lisha Peng, Beijing (CN); Wei Zhao, Beijing (CN); Shen Wang, Beijing (CN); Zijing Huang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 16/904,075

(22) Filed: Jun. 17, 2020

(65) Prior Publication Data
US 2021/0181270 A1 Jun. 17, 2021

(30) Foreign Application Priority Data
Dec. 13, 2019 (CN) .......................... 201911280680.6

(51) Int. Cl.
*G01R 33/00* (2006.01)
*G01R 33/038* (2006.01)
*H01F 7/02* (2006.01)

(52) U.S. Cl.
CPC ....... *G01R 33/0094* (2013.01); *G01R 33/038* (2013.01); *H01F 7/02* (2013.01)

(58) Field of Classification Search
CPC ...... G01R 33/0094; G01R 33/038; H01F 7/02
USPC .......................................................... 324/228
See application file for complete search history.

(56) References Cited

U.S. PATENT DOCUMENTS

| 2007/0125182 | A1* | 6/2007 | Garshelis | G01R 33/038 73/779 |
| 2013/0024135 | A1* | 1/2013 | Blum | G01R 33/072 702/38 |
| 2015/0061659 | A1* | 3/2015 | Freear | G01N 27/72 324/238 |

FOREIGN PATENT DOCUMENTS

| CN | 103675094 | 3/2014 |
| CN | 105758931 | 7/2016 |
| CN | 107255671 | 10/2017 |

OTHER PUBLICATIONS

Postolache, Octavian, A. Lopes Ribeiro, and Helena Geirinhas Ramos. "Uniform eddy current probe based on GMR sensor array and image processing for NDT." 2012 IEEE International Instrumentation and Measurement Technology Conference Proceedings. IEEE, 2012. (Year: 2012).*

(Continued)

*Primary Examiner* — Christopher P McAndrew
(74) *Attorney, Agent, or Firm* — Hodgson Russ LLP

(57) ABSTRACT

A device and a method for detecting a defect contour with omnidirectionally equal sensitivity based on magnetic excitation are provided. The device includes a magnetic sensor array arranged in a spatially uniform magnetic field and configured to collect a magnetic field signal, and a data analysis module configured to analyze the magnetic field signal, extract a distorted magnetic field signal, and obtain an image of the defect contour based on the distorted magnetic field signal.

13 Claims, 3 Drawing Sheets

(56) References Cited

OTHER PUBLICATIONS

Meyer, A., et al. "Fully automated rotor inspection apparatus with high flexibility for permanent magnet synchronous motors using an improved hall sensor line array." 2015 5th International Electric Drives Production Conference (EDPC). IEEE, 2015. (Year: 2015).*
CNIPA, First Office Action for CN Application No. 201911280680.6, dated Jul. 6, 2021.

* cited by examiner

DEVICE AND METHOD FOR DETECTING DEFECT CONTOUR WITH OMNIDIRECTIONALLY EQUAL SENSITIVITY BASED ON MAGNETIC EXCITATION

CROSS REFERENCE TO RELATED APPLICATIONS

This application claims priority and benefits to Chinese Application No. 201911280680.6, filed on Dec. 13, 2019, the entire content of which is incorporated herein by reference.

TECHNICAL FIELD

The present disclosure relates to a field of non-destructive detection technology, and more particularly, to a device and a method for detecting a defect contour with omnidirectionally equal sensitivity based on magnetic excitation.

BACKGROUND

Nondestructive detection technology is a method to detect superficial and internal defects by using interactions between sound, light, electricity as well as magnetism and a component to be detected, without damaging an object to be tested. A method for testing a ferromagnetic material mainly includes a testing method based on magnetic particles, a penetrant-based testing method, a testing method based on magnetic flux leakage, a testing method based on eddy current and a testing method based on ultrasonic.

SUMMARY

Embodiments of the present disclosure provide a device for detecting a defect contour with omnidirectionally equal sensitivity based on magnetic excitation. The device includes a magnetic sensor array and a data analysis module.

The magnetic sensor array is arranged in a spatially uniform magnetic field.

The data analysis module is configured to analyze the magnetic field signal, to extract a distorted magnetic field signal and obtain an image of the defect opening contour based on the distorted magnetic field signal.

Embodiments of the present disclosure further provide a method for detecting a defect contour with omnidirectionally equal sensitivity based on magnetic excitation. The method includes:

generating a spatially uniform magnetic field;

obtaining a magnetic field signal, and extracting a distorted magnetic field signal; and obtaining an image of a defect opening contour based on the distorted magnetic field signal.

Embodiments of the present disclosure further provide a non-transitory computer readable storage medium, having instructions stored thereon. When the instructions are executed by a processor, the processor is configured to obtain a magnetic field signal from a magnetic sensor array, and analyze the magnetic field signal to extract a distorted magnetic field signal and to obtain an image of the defect contour based on the distorted magnetic field signal, in which the magnetic sensor array is arranged with a spatially uniform magnetic field.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

The above and/or additional aspects and advantages of embodiments of the present disclosure will become apparent and more readily appreciated from the following descriptions made with reference to the drawings, in which.

Figure 1:
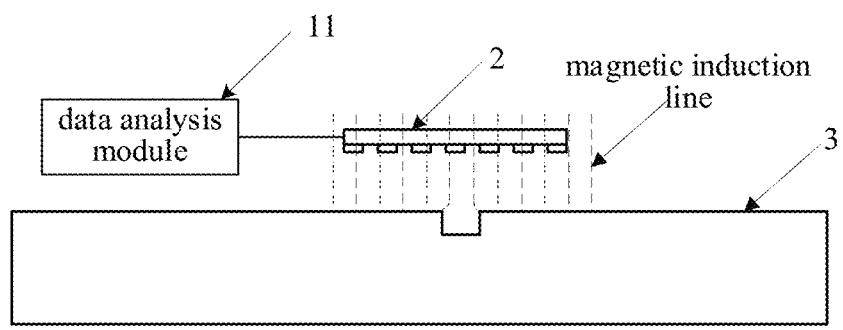
FIG. 1 is a schematic diagram illustrating a device for detecting a defect contour with omnidirectionally equal sensitivity based on magnetic excitation according to an embodiment of the present disclosure.

Reference numerals: 1—permanent magnet, 2—magnetic sensor array, 3—component to be detected, 4—magnetic induction line, 5—PCB board, 6—magnetic chip, 7—lifting control motor, 8—precision screw, 9—drive wheel, 10—data acquisition module, 11—data analysis module, 12—first bracket, 13—second bracket.

DETAILED DESCRIPTION

Embodiments of the present disclosure will be described in detail and examples of embodiments are illustrated in the drawings. The same or similar elements and the elements having the same or similar functions are denoted by like reference numerals throughout the descriptions. Embodiments described herein with reference to drawings are explanatory, serve to explain the present disclosure, and are not construed to limit embodiments of the present disclosure.

Defect may cause catastrophic failures on ferromagnetic materials. Thus, defect detection and evaluation are necessary. The level of danger may depend on the size of the defect. To get a reliable detection result of the size of the defect, it is essential to accurately identify an opening contour of the defect.

At present, a method for testing a ferromagnetic material mainly includes a testing method based on magnetic particles, a penetrant-based testing method, a testing method based on magnetic flux leakage, a testing method based on eddy current and a testing method based on ultrasonic.

In the testing method based on magnetic particles, the component needs to be magnetized first, and residual magnetism at the defect may attract fine particles to reflect the defect contour. In the penetrant-based testing method, penetrant agent is penetrated into the component under the surface to observe reversed osmosis, to test the defect contour. Both the testing method based on magnetic particles and the penetrant-based testing method need to clean the surface of the component and wash the component after the testing, such that information of the depth of the defect cannot be reflected and they are not good for defect assessment. The testing method based on magnetic flux leakage needs to magnetize the tested component to a saturation state or a near-saturation state, such that the magnetic block and the yoke form a circuit, which is bulky and heavy. In addition, this testing method is only sensitive to a defect perpendicular to the magnetization direction. In order to realize an omnidirectional detection on the defect, additional magnetization device is needed. In addition, the unevenness of magnetic field on the surface of ferromagnetic material to be tested may also lead to the compression distortion of the defect contour. As a result, error of the evaluation of the defect opening is large. In the testing method based on eddy current, a signal excitation device is needed, and the acquired signal is the impedance of coils. Therefore, it is difficult to carry out inversion of the defect contour. The testing method based on ultrasonic can be used for non-contact and long-distance detection, but it needs coupling agent and has high power consumption.

Therefore, embodiments of the present disclosure provide a device and a method for detecting a defect contour with omnidirectionally equal sensitivity based on magnetic excitation.

Now, the device for detecting a defect contour with omnidirectionally equal sensitivity based on magnetic excitation according to embodiments of the present disclosure is described with reference to drawings.

FIG. 1 is a schematic diagram illustrating a device for detecting a defect contour with omnidirectionally equal sensitivity based on magnetic excitation according to embodiments of the present disclosure. As illustrated in FIG. 1, the device includes a magnetic sensor array and a data analysis module.

The magnetic sensor array is arranged in a spatially uniform magnetic field, and is configured to collect a magnetic field signal.

The data analysis module is configured to analyze the magnetic field signal, to extract a distorted magnetic field signal and to obtain an image of the defect contour based on the distorted magnetic field signal.

In an example, the spatially uniform magnetic field may be generated by a permanent magnet, a direct-current coil or the like, which is not limited in the present disclosure.

Figure 2:
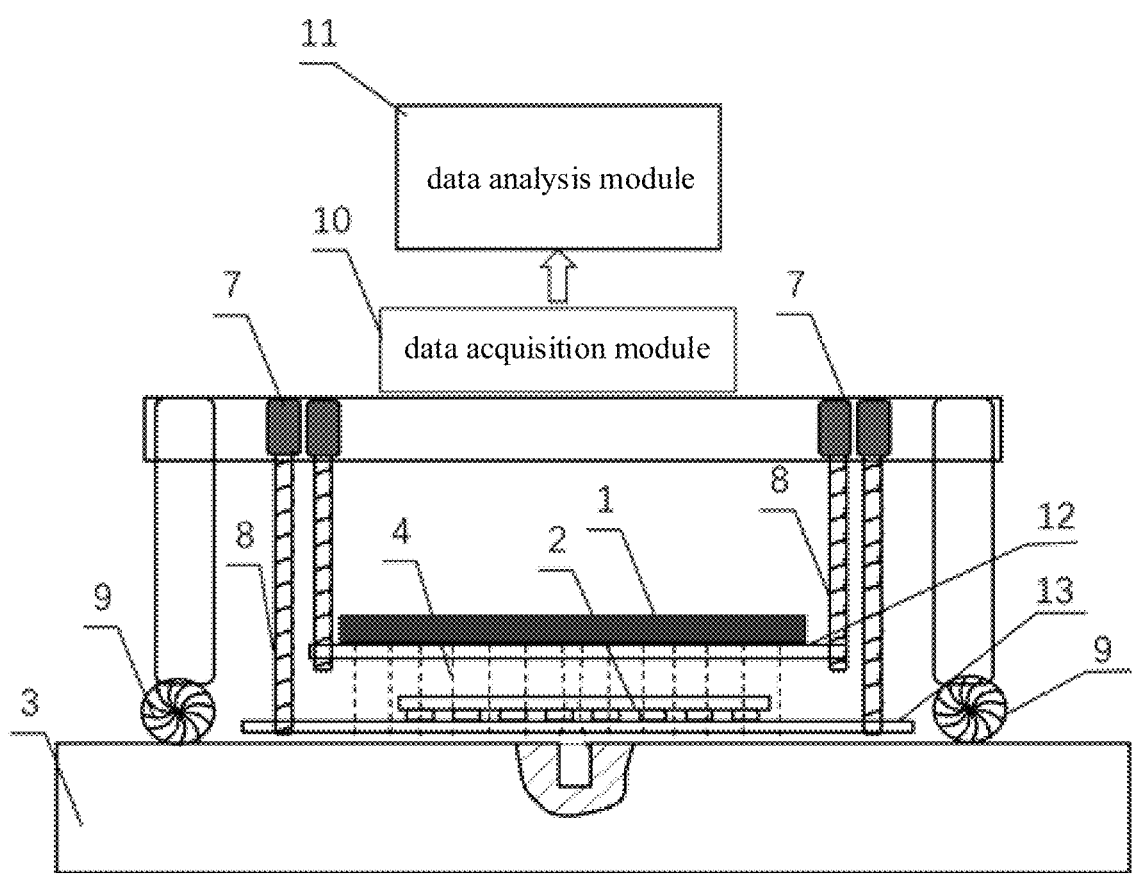
FIG. 2 is a schematic diagram illustrating a device for detecting a defect contour with omnidirectionally equal sensitivity based on magnetic excitation according to an embodiment of the present disclosure.

As illustrated in FIG. 2, in cases that the spatially uniform magnetic field is generated by the permanent magnet, the device may include a permanent magnet, a magnetic sensor array, a lifting control module used for the permanent magnet and the magnetic sensor array, a scanning drive module, a data acquisition module, and a data analysis module.

The permanent magnet is placed above the component to be detected to form a magnetic field.

The magnetic sensor array is placed between the component to be detected and the permanent magnet. The magnetic sensor array is parallel to the component to be detected, and is configured to collect a magnetic field signal.

In an example, the magnetic sensor array and the permanent magnet are centrally aligned, such that the magnetic field where the magnetic sensor array is located is spatially uniform.

The lifting control module used for the permanent magnet and the magnetic sensor array is configured to control the permanent magnet and the magnetic sensor array to move up and down, to adjust a first distance of the permanent magnet from the component to be detected and a second distance of the magnetic sensor array from the component to be detected.

The scanning drive module is configured to control the permanent magnet and the magnetic sensor array to move along the surface of the component to be detected.

The data acquisition module is configured to acquire the magnetic field signal collected by the magnetic sensor array.

The data analysis module is in communication with the data acquisition module and is configured to analyze the magnetic field signal acquired by the data acquisition module and obtain and provide an image of the defect contour.

Figure 3:
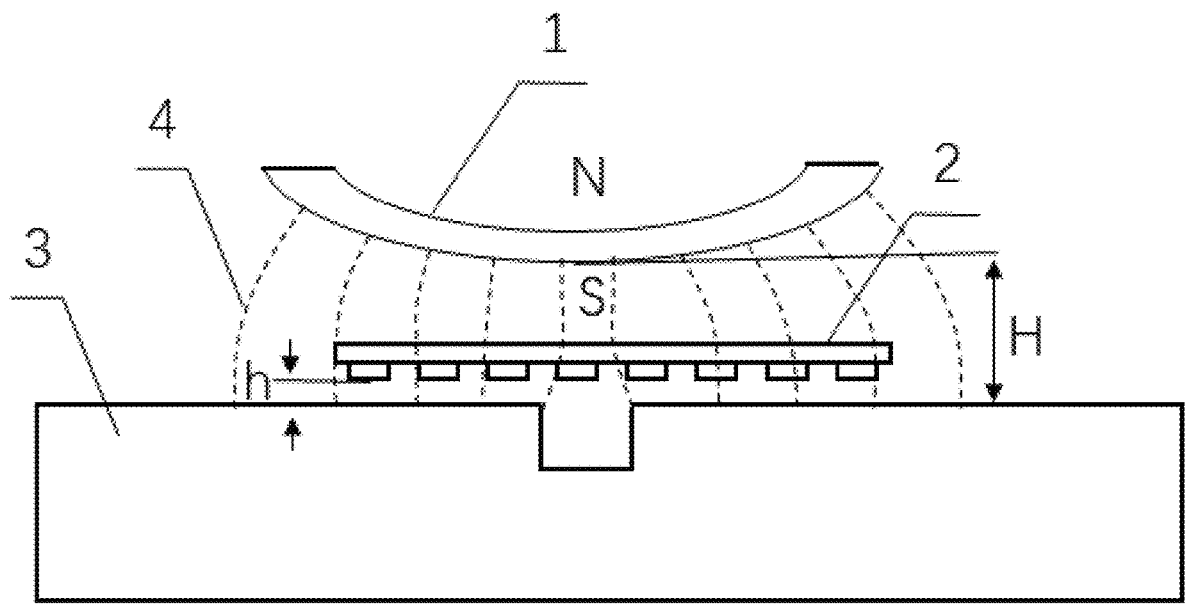
FIG. 3 is a schematic diagram illustrating a principle of detecting a defect contour with omnidirectionally equal sensitivity based on magnetic excitation according to another embodiment of the present disclosure.

It can be understood that the permanent magnet is placed above the component to be detected, a spatially uniform magnetic field is established by the permanent magnet above the material surface of the component to be detected, and a direction of the magnetic induction line is perpendicular to the surface of the component to be detected. As illustrated in FIG. 3, the magnetic induction lines are all perpendicular to the surface of the component to be detected. The component to be detected is of the ferromagnetic material.

In embodiments of the present disclosure, the permanent magnet is arranged above the component to be detected and the first distance of the permanent magnet from the surface of the component to be detected ranges from 20 mm to 100 mm. The magnetic sensor array is arranged directly below the permanent magnet and the second distance of the magnetic sensor array from the component to be detected ranges from 0 mm to 20 mm. The magnetic sensor array is arranged parallel to the surface of the ferromagnetic material to be detected.

In some examples, the permanent magnet is arranged above the material surface of the component to be detected at the first distance of 20 mm from the material surface, and a uniform magnetic field is established above the surface of the component to be detected. The magnetic sensor array is arranged above the surface of the component to be detected at the second distance of 1 mm from the surface. If the component to be detected has a defect on the surface, this defect may cause a local distortion on the magnetic field, which may be detected by the magnetic sensor array, such that the opening contour of the defect may be detected.

In embodiments of the present disclosure, the permanent magnet may include, but not limited to, a rectangular magnet, an arc-shaped magnet, a spherical magnet, and a polyhedral magnet. In an example, the material of the permanent magnet is neodymium iron boron. In an example, the size of the rectangular permanent magnet is 240 mm long, 240 mm wide, and 7 mm high.

Further, in order to ensure the uniformity of the magnetic field where the magnetic sensor array is located, an area of a projection of the permanent magnet on the component to be detected may be different from an area of a parallel surface of the magnetic sensor array to the component to be detected. In an example, a ratio of the area of the parallel surface to the area of the projection is less than 2/3. As another example, the ratio of the area of the parallel surface to the area of the projection is 1/6.

Figure 4:
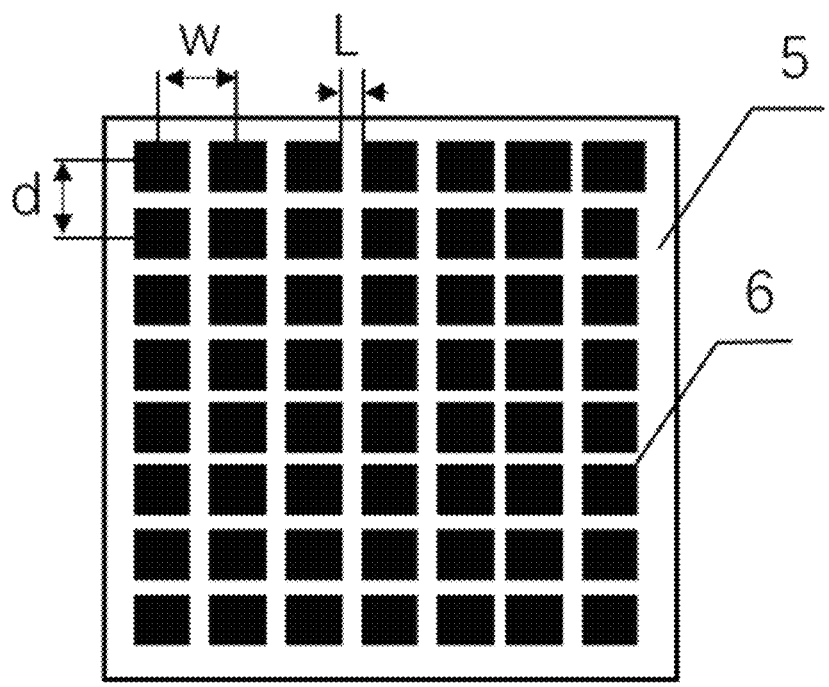
FIG. 4 is a schematic diagram illustrating a three-dimensional magnetic sensor array according to an embodiment of the present disclosure.

As illustrated in FIG. 4, a three-dimensional magnetic sensor array is provided. The magnetic sensors 6 are distributed on the PCB board 5 at equal intervals. That is, both w and d equal to 5 mm. In an example, the magnetic sensor 6 is a magnetic sensing chip. In order to improve resolution, the interval L between the sensors may equal to 1 mm. FIG. 4 is only for clearly understanding the arrangement of magnetic chips, which does not mean that the magnetic sensor array is only a planar array. For example, for detecting a pipeline, a curved array is needed to enable the sensor array parallel to the surface of the pipeline. The specific design of the magnetic sensor array can be adjusted based on the structure of the component to be detected.

As illustrated in FIG. 2, the lifting control module used for the permanent magnet and the magnetic sensor array may include a first bracket 12, a second bracket 13, precision screws 8, and lifting control motors 7.

The permanent magnet is arranged on the first bracket, and the magnetic sensor array is arranged on the second bracket. In an example, the magnetic field that is formed by the permanent magnet and where the magnetic sensor array is located is spatially uniform. In another example, the magnetic sensor array and the permanent magnet are centrally aligned.

The first bracket and the second bracket are respectively connected to respective precision screws. Each of the precision screws is equipped with a respective lifting control motor. The upper end of each precision screw is connected to a support. The lifting control motors are configured to control the precision screws such that the precision screws may drive the first bracket and the second bracket to move up and down to adjust the first distance of the permanent magnet from the component to be detected and the second distance of the magnetic sensor array from the component to be detected.

It can be understood that the permanent magnet is arranged on the first bracket, and the magnetic sensor array is arranged on the second bracket. The first bracket and the second bracket are connected to the support through the precision screws. The upper end of each precision screw is equipped with the lifting control motor that is configured to control the lifting of both the first bracket and the second bracket based on the magnetic characteristics and surface characteristics of the component to be detected to adjust the first distance of the permanent magnet from the component to be detected and the second distance of the magnetic sensor array from the component to be detected. Therefore, detection accuracy may be improved. In an example, the first bracket and the second bracket may be separately controlled by two lifting control motors.

For example, as described above, the first distance of the permanent magnet from the surface of the component to be detected may be adjusted from 20 mm to 100 mm, and the second distance of the magnetic sensor array from the component to be detected may be adjusted from 0 mm to 20 mm.

As illustrated in FIG. 2, the scanning drive module may include: a scanning drive motor and driving wheels.

The driving wheels are connected to the scanning driving motor, and the driving wheels are connected to the support through support rods. The scanning drive motor drives the driving wheels to rotate, such that the support, the permanent magnet and the magnetic sensor array are driven to move along the surface of the component to be detected.

It can be understood that, with the scanning drive module, the permanent magnet and the magnetic sensor array may be moved along the surface of the component to be detected such that the defect detection in all directions may be performed on various positions of the component to be detected.

Rotation of the driving wheels may be driven by the scanning drive motor. The driving wheels are connected to the support rods and the support rods are connected to the support. When the driving wheels are moving, the first bracket and the second bracket connected to the support may move together with the driving wheels, to scan the component to be detected, such that multi-position detection of the defect may be realized. In embodiments of the present disclosure, the driving motors may be arranged in the driving wheels, or may be arranged on the support rods connected to the driving wheels, or at other positions, which is not limited in the present disclosure.

A spatially uniform magnetic field where the magnetic sensor array is located may be established by the permanent magnet above the surface of the component to be detected. During the scanning, when there is no defect on the surface of the component to be detected, the magnetic induction lines are all perpendicular to the surface of the component to be detected. The magnetic field signal without distortions may be collected by magnetic sensor array and provided to the data acquisition module 10. In addition, the data is provided from the data acquisition module 10 to the data analysis module 11. The data analysis module 11 is configured to analyze the data to obtain an image that the component to be detected has no defect on the surface.

When there is a defect on the surface of the component to be detected, a distortion of the magnetic field may occur at the defect and the most sharply distortion is happened on each edge of the defect. In an example, the edge of the defect may cause changes of the magnetic field in a normal direction of the surface of the component to be detected to generate a distorted magnetic field signal. This distorted magnetic field signal may be collected by the magnetic sensor array. The data may be acquired by the data acquisition module 10, and the data indicating the acquired distorted magnetic field signal may be sent to the data analysis module 11 such that the data analysis module 11 may analyze the data to obtain the image that the component to be detected has a defect on the surface. Therefore, a defect contour image may be obtained to provide a shape of the defect opening contour.

In an example, the data acquisition module 10 may be a FPGA, a DSP, and a single chip microcomputer. An update rate of obtaining the image is greater than 1000 times per second.

In an example, the data analysis module 11 may be a processor.

Figure 5:
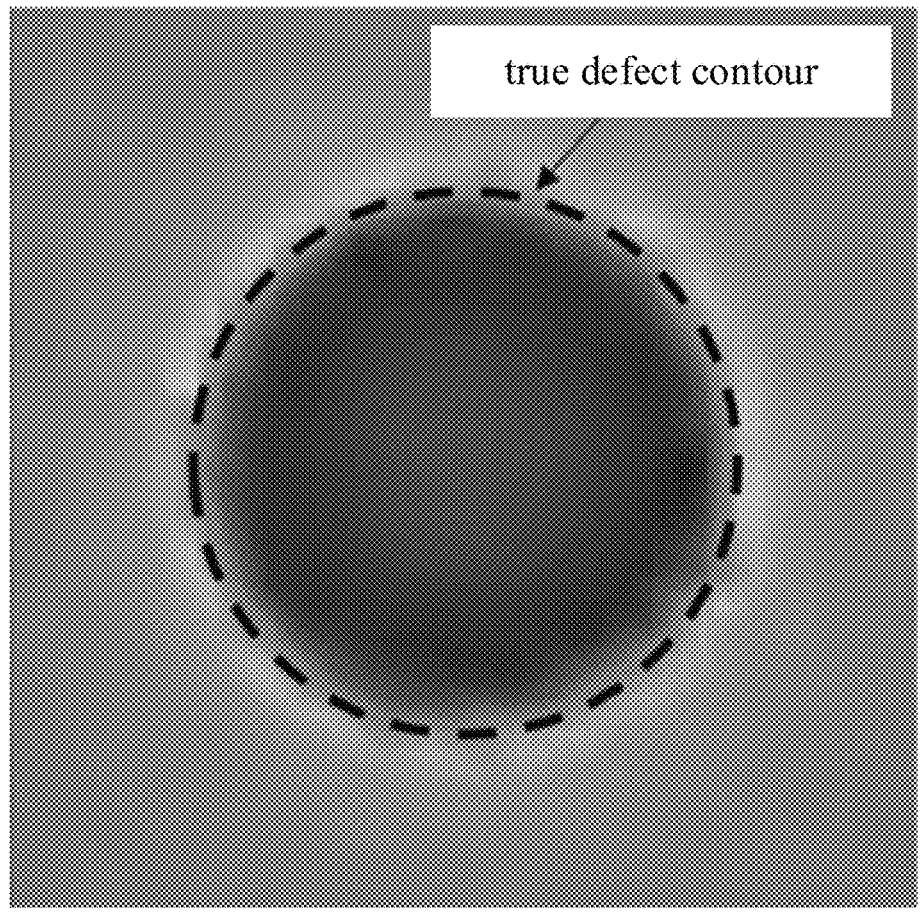
FIG. 5 is a diagram illustrating detection of a defect contour with omnidirectionally equal sensitivity based on magnetic excitation according to an embodiment of the present disclosure.

As illustrated in FIG. 5, a schematic diagram illustrating a resultant image of the defect contour is provided. In fact, the true opening contour of the defect is a circle. For example, the opening contour of the defect is a circle with a radius of 12 mm, and the depth of the defect is 2 mm. The dotted line in FIG. 5 indicates the true opening contour of the defect. As can be seen from the schematic diagram of the resultant image, the device for detecting a defect contour with omnidirectionally equal sensitivity based on magnetic excitation can perform an omnidirectional detection on edges of the defect, and have characteristics of same detection sensitivity in all directions, such that an equally scaled restoration of the true defect contour may be obtained with a high precision.

With the device for detecting a defect contour with omnidirectionally equal sensitivity based on magnetic excitation according to embodiments of the present disclosure, through the permanent magnet, the magnetic sensor array, the data acquisition module, the data analysis and imaging module, the lifting control module used for the permanent magnet and the magnetic sensor array and the scanning drive module, an omnidirectional defection of the defect may be realized on the surface of ferromagnetic material, and the detection sensitivity is same in all directions. By detecting changes of the magnetic field in the normal direction of the component to be detected, the image of the defect opening contour can be directly obtained in real proportion without any complex algorithms. In addition, since the sensor array is placed in the uniform magnetic field, the defect opening contour identified has no distortion. Furthermore, the detection device is simple, the cost is low, and the volume is small. Moreover, the detection method is easy to implement and the detection speed is fast, which is of great significance for the assessment of the defect hazard.

Now, a method for detecting a defect contour with omnidirectionally equal sensitivity based on magnetic excitation according to an embodiment of the present disclosure will be described with reference to the drawings.

Figure 6:
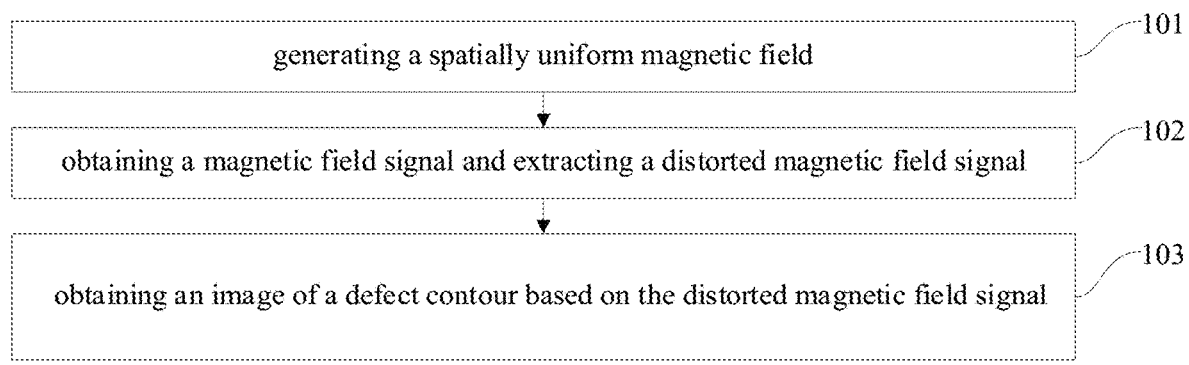
FIG. 6 is a flow chart illustrating a method for detecting a defect contour with omnidirectionally equal sensitivity based on magnetic excitation according to an embodiment of the present disclosure.

FIG. 6 is a flowchart illustrating a method for detecting a defect contour with omnidirectionally equal sensitivity based on magnetic excitation according to an embodiment of the present disclosure.

As illustrated in FIG. 6, the method may include the following.

In block 101, a spatially uniform magnetic field is generated.

In an example, the spatially uniform magnetic field may be generated by a permanent magnet or a direct-current coil, which is not limited.

In an example, the permanent magnet for generating the spatially uniform magnetic field is arranged above a component to be detected. In addition, magnetic induction lines of the spatially uniform magnetic field may be perpendicular to a surface of the component to be detected.

In block 102, a magnetic field signal is obtained and a distorted magnetic field signal is extracted.

In an example, the magnetic field signal is obtained by a magnetic sensor array.

In an example, the magnetic sensor array is arranged between the permanent magnet and the component to be detected. In addition, the magnetic sensor array and the permanent magnet are centrally aligned.

In an example, a ratio of an area of a parallel surface of the magnetic sensor array to the component to be detected to an area of a projection of the permanent magnet on the component to be detection is less than 2/3. In an example, the ratio is 1/6.

In block 103, an image of the defect contour is obtained based on the distorted magnetic field signal.

In an example, the permanent magnet may be arranged above the component to be detected. The method may further include adjusting a first distance of the permanent magnet from the component to be detected to such that the first distance is greater than 20 mm and less than or equal to 100 mm.

In an example, the magnetic sensor array may be arranged above the component to be detected. The method may further include adjusting a second distance of the magnetic sensor array from the component to be detected, such that the second distance is greater than 0 mm and less than or equal to 20 mm.

In an example, the magnetic sensor array may be driven to move along the surface of the component to be detected. It should be noted that the foregoing explanation and description of embodiments of the device is also applicable to embodiments of the method, which is not repeated here.

With the method according to embodiments of the present disclosure, the magnetic sensor array is located in the uniform magnetic field. The changes of the magnetic field in the normal direction are caused by each edge of the defect of the component to be detected. The changes of the magnetic field are collected by the magnetic sensor array, to detect the defect opening contour. The detection method is easy to implement and the detection speed is fast. In addition, the detection device is simple, the cost is low, and the volume is small, which is of great significance to the assessment of the defect hazard.

As an example, the method may include the following. A permanent magnet is placed above a component to be detected to establish a spatially uniform magnetic field above the surface of the component to be detected. A magnetic sensor array is placed between the permanent magnet and the component to be detected. A magnetic field signal on the surface of the component to be detected is collected by the magnetic sensor array, and the collected magnetic field signal is analyzed to obtain an image of the defect opening contour of the component to be detected.

Embodiments of the present disclosure further provide a non-transitory computer readable storage medium. The medium has instruction stored thereon. When the instructions are executed by a processor, the processor is configured to execute the method discussed above.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

In the present disclosure, unless specified or limited otherwise, the first characteristic is "on" or "under" the second characteristic refers to the first characteristic and the second characteristic can be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

The logic and/or steps described in other manners herein or illustrated in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but not an exhaustive list: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A device for detecting a defect contour with omnidirectionally equal sensitivity based on a magnetic excitation, comprising: a magnetic sensor array, a processor, a permanent magnet, and a lifting controller comprising a first bracket, a second bracket, and lifting control motors; wherein,
the magnetic sensor array is arranged in a spatially uniform magnetic field, and is configured to collect a magnetic field signal;
the processor is configured to analyze the magnetic field signal, to extract a distorted magnetic field signal and to obtain an image of the defect contour based on the distorted magnetic field signal;
the permanent magnet is placed above a component to be detected and placed on the first bracket, wherein the component to be detected is of a ferromagnetic material, magnetic induction line of the spatially uniform magnetic field is perpendicular to a surface of the component to be detected, and the spatially uniform magnetic field is generated by the permanent magnet;
the magnetic sensor array is placed between the permanent magnet and the component to be detected and is placed on the second bracket; and
the lifting control motors are configured to control the first bracket and the second bracket to move up and down separately to adjust a first distance of the permanent magnet from the component to be detected and a second distance of the magnetic sensor array from the component to be detected.

2. The device according to claim 1, wherein the permanent magnet and the magnetic sensor array are centrally aligned to each other.

3. The device according to claim 1, wherein a ratio of an area of a parallel surface of the magnetic sensor array to the component to be detected to an area of a projection of the permanent magnet on the component to be detected is less than 2/3.

4. The device according to claim 1, where a ratio of an area of a parallel surface of the magnetic sensor array to the component to be detected to an area of a projection of the permanent magnet on the component to be detected is 1/6.

5. The device according to claim 1, wherein the magnetic sensor array is placed above the component to be detected, and a distance of the magnetic sensor array from the component to be detected is greater than 0 mm and less than or equal to 20 mm.

6. The device according to claim 1, wherein the permanent magnet is placed above the component to be detected, and a distance of the permanent magnet from the component to be detected is greater than 20 mm and less than or equal to 100 mm.

7. The device according to claim 1, further comprising a scanning driver, wherein the scanning driver comprises a scanning drive motor; and
the scanning driver is configured to drive the magnetic sensor array and the permanent magnet to move horizontally along the surface of the component to be detected.

8. The device according to claim 1, wherein the permanent magnet comprises a rectangular magnet, an arc-shaped magnet, a spherical magnet, and a polyhedral magnet.

9. A method for detecting a defect contour with omnidirectionally equal sensitivity based on magnetic excitation, comprising:
generating a spatially uniform magnetic field, comprising: generating a spatially uniform magnet field by a permanent magnet, wherein the permanent magnet is arranged above a component to be detected, the component to be detected is of a ferromagnetic material, and magnetic induction line of the spatially uniform magnetic field is perpendicular to a surface of the component to be detected;
obtaining a magnetic field signal, comprising: obtaining the magnetic field signal by a magnetic sensor array, the magnetic sensor array being arranged between the permanent magnet and the component to be detected, and extracting a distorted magnetic field signal, wherein the permanent magnet is placed on a first bracket, and the magnetic sensor array is placed on a second bracket;

controlling the first bracket and the second bracket to move up and down separately to adjust a first distance of the permanent magnet from the component to be detected and a second distance of the magnetic sensor array from the component to be detected; and obtaining an image of the defect contour based on the distorted magnetic field signal.

10. The method according to claim 9, wherein the permanent magnet and the magnetic sensor array are centrally aligned to each other.

11. The method according to claim 9, wherein a ratio of an area of a parallel surface of the magnetic sensor array to the component to be detected to an area of a projection of the permanent magnet on the component to be detected is less than 2/3.

12. The method according to claim 9, where a ratio of an area of a parallel surface of the magnetic sensor array to the component to be detected to an area of a projection of the permanent magnet on the component to be detected is 1/6.

13. A non-transitory computer readable storage medium, having instructions stored thereon, wherein, when the instructions are executed by a processor, the processor is configured to:

obtain a magnetic field signal from a magnetic sensor array, and analyze the magnetic field signal to extract a distorted magnetic field signal and to obtain an image of the defect contour based on the distorted magnetic field signal, wherein the magnetic sensor array is arranged with a spatially uniform magnetic field generated by a permanent magnet, the permanent magnet is arranged above a component to be detected and placed on a first bracket, the component to be detected is of a ferromagnetic material, magnetic induction line of the spatially uniform magnetic field is perpendicular to a surface of the component to be detected, and the magnetic sensor array is placed on a second bracket; and control the first bracket and the second bracket to move up and down separately to adjust a first distance of the permanent magnet from the component to be detected and a second distance of the magnetic sensor array from the component to be detected.

\* \* \* \* \*